United States Patent [19]
Liang et al.

[11] Patent Number: 5,218,215
[45] Date of Patent: Jun. 8, 1993

[54] SEMICONDUCTOR DEVICE PACKAGE HAVING A THERMAL DISSIPATION MEANS THAT ALLOWS FOR LATERAL MOVEMENT OF THE LEAD FRAME WITH RESPECT TO THE HOUSING WITHOUT BREAKAGE OF THE THERMAL DISSIPATION PATH

[75] Inventors: Louis Liang, Los Altos; Jon M. Long, Livermore, both of Calif.

[73] Assignee: VLSI Technology, Inc., San Jose, Calif.

[21] Appl. No.: 630,113

[22] Filed: Dec. 19, 1990

[51] Int. Cl.$^5$ .................... H01L 23/02; H01L 39/02; H02B 1/00; H05K 7/20
[52] U.S. Cl. .................... 257/712; 361/388; 361/389; 257/701; 257/678
[58] Field of Search ............ 357/81, 74, 72, 80; 361/388, 389

[56] References Cited

U.S. PATENT DOCUMENTS

| | | | |
|---|---|---|---|
| 4,396,936 | 8/1983 | McIver et al. | 357/81 |
| 4,751,611 | 6/1988 | Arai et al. | 361/388 |
| 4,887,147 | 12/1989 | Friedman | 357/81 |
| 5,008,737 | 4/1991 | Burnham et al. | 357/81 |

OTHER PUBLICATIONS

"Information About Silicone Compounds".
"Surface Solder Package," IBM Technical Disclosure Bulletin, vol. 30, No. 3, pp. 1240–1241, Aug. 1987.

Primary Examiner—Andrew J. James
Assistant Examiner—Carl Whitehead, Jr.
Attorney, Agent, or Firm—Majestic, Parson, Siebert & Hsue

[57] ABSTRACT

A semiconductor device package is disclosed which facilitates the dissipation of heat generated by the enclosed semiconductor device. The package comprises a housing apparatus having a plurality of portions, a holding apparatus having a semiconductor device thermally attached, a thermal path formed within at least one of the portions of the housing apparatus, and a thermally conductive connection for thermally connecting the holding apparatus to the thermal path. The portions of the housing apparatus join together to form an enclosed chamber which encases the holding apparatus, the semiconductor device, and the thermally conductive connection. The thermal path thermally connects the interior of the package to the external environment. By thermally connecting the holding apparatus to the thermal path formed within the housing apparatus, a direct thermal path is created between the device and the external environment so that heat from the device may readily escape from the interior of the package.

13 Claims, 2 Drawing Sheets

SEMICONDUCTOR DEVICE PACKAGE HAVING A THERMAL DISSIPATION MEANS THAT ALLOWS FOR LATERAL MOVEMENT OF THE LEAD FRAME WITH RESPECT TO THE HOUSING WITHOUT BREAKAGE OF THE THERMAL DISSIPATION PATH

BACKGROUND OF THE INVENTION

This invention relates to semiconductor device packages and more specifically to a package which readily carries heat away from the semiconductor device.

The dissipation of heat from semiconductor devices is a major consideration in packaging technology. Heat retention within the package causes the device to function more slowly and in some cases, even causes damage to the device. As a result, it is vital that the package be able to carry heat away from the semiconductor chip. Heat retention is a particular problem in plastic packages due to the fact that plastic is a thermal insulator. The plastic packages of the past have relied on the conductive leads of the lead frame supporting the device to carry away the heat generated by the device. However, due to their large density and size, the devices of today generate a larger amount of heat than the leads themselves can adequately dissipate. Despite their poor thermal characteristics, plastic packages are still preferred by device manufacturers for two major reasons. The first reason is that the cost of plastic packages is quite low as opposed to the high cost of other packages like ceramic packages. Second, plastic packages can be produced quickly and easily so that they lend themselves to large scale production. Due to the attractiveness of plastic packages, it would be desirable to develop a plastic package which exhibits improved heat dissipation characteristics. The heat dissipation concern is most pressing in plastic packages but it is not limited to just those packages. Improved heat dissipation characteristics are desirable in other types of packages as well.

Therefore, it is an object of the invention to provide a semiconductor device package which is capable of dissipating a large amount of heat.

Another object of the invention is to provide such a package which can be economically produced.

Yet another object of the invention is to provide such a package which may be quickly and easily produced.

SUMMARY OF THE INVENTION

The present invention is based on the observation that the thermal characteristics of a package may be improved by either employing a thermally conductive housing or forming a thermally conductive path within the housing of the package itself which would enable heat generated in the interior of the package to travel to the exterior of the housing. The invention is also based on the observation that the holding means which supports the semiconductor die inside the package need not be physically fastened to the housing or the thermally conductive path formed within the housing. The holding means only needs to be thermally connected to the thermal path. This eliminates the process of adhering the holding means to the housing of the package which involves a difficult process of precisely aligning the holding means with the housing of the package and a laborious process of curing the epoxy usually used to fasten the holding means to the housing. As a result, the package of the invention may be easily produced.

In accordance with these observations, the package of the invention comprises a housing means having a plurality of portions, a thermally conductive holding means for holding and supporting a semiconductor die, and a thermally conductive path within at least one of the portions of the housing means for thermally connecting the holding means to the outside environment in order to dissipate heat. The semiconductor die, which is the source of the heat, is thereby thermally connected to the outside environment through the holding means and the path so that heat generated by the die is readily dissipated.

The holding means and the path are not physically fastened to the die but only provides a thermal connection; the holding means also physically supports the die. This is significant since the invention eliminates the need for a tedious and difficult adhering process. This results in less labor and production equipment being required which, in turn, reduces the cost and effort involved in producing the package. After the holding means is thermally connected to the thermal path, the portions of the housing are brought together to form an enclosed chamber which encases the holding means and the device.

A preferred embodiment of the invention comprises a thermally insulating or semi-insulating clam-shell type housing means having two portions which join together to form an enclosed chamber, a thermally conductive structure formed within one of the housing portions, a lead frame for supporting a semiconductor die, and a thermally conductive and highly viscous medium such as silicon grease or zinc oxide. The thermally conductive structure comprises a layer of metal on the interior side of the housing portion, a layer of metal on the exterior side of the housing portion, and a plurality of metal vias thermally connecting the two layers of metal. The semiconductor device is thermally and physically attached to the central portion of the lead frame. The lead frame is in turn thermally connected but not physically attached to the thermally conductive structure by the conductive medium such that the semiconductor device is thermally connected to the exterior of the package. The central portion of the lead frame, the semiconductor device, and the conductive medium are then all encased within the housing means. The package thus described allows heat from the device to travel through the conductive structure to quickly escape to the external environment.

An alternate embodiment of the invention comprises a thermally conductive housing means having two portions, a lead frame for supporting a semiconductor die, and a thermally conductive and highly viscous medium such as silicon grease or zinc oxide. The central portion of the lead frame, which has the semiconductor die thermally and physically attached thereto, is thermally connected to one of the portions of the housing means by the conductive medium. Because the housing means is composed of conductive material, no thermal path needs to be formed within the housing means. Since the conductive medium does not physically attach the lead frame to the housing, no difficult adhering process is necessary. Therefore, the effort needed to produce the package is minimized.

This invention is also applicable in tape automated bonding (TAB), flip-chip and other wireless type interconnect packages. For such packages, the semiconductor device such as a die is supported both by an electrically insulating substrate with conductive traces thereon, where the traces are bonded to the device, and by a thermally conductive holding means such as a layer of thermal grease placed on top of the bottom wall of a housing and connected to the bottom of the device. Since the top of the device is also accessible, a second thermally conductive path may be established by connecting the top of the device to the top wall of the housing by another thermally connecting means such as thermal grease. In TAB, flip-chip or other wireless type interconnect packages, no individual bonding wires are used so that there is no danger of causing damage to the wires or the wire bonds when the connecting means such as thermal grease is applied to the top surface of the device.

DETAILED DESCRIPTION OF THE INVENTION

Figure 1:
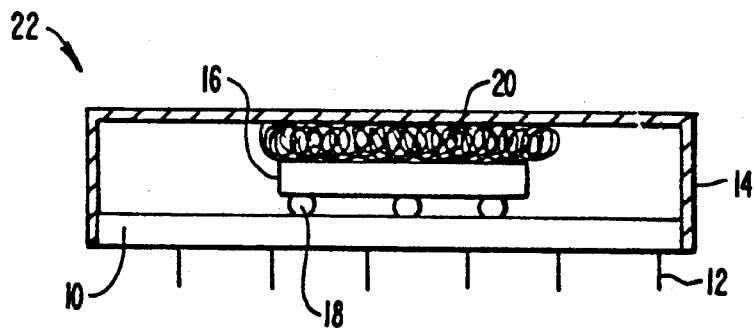
FIG. 1 is a cross-sectional view of a prior art package for facilitating heat dissipation which could only accommodate flip-chip semiconductor devices. The interconnect structure shown in FIG. 1 is typically used in ceramic packages.

With reference to FIG. 1, a cross-sectional view of a prior art semiconductor device package 22 for facilitating heat dissipation is shown, comprising a ceramic substrate 10 having a plurality of electrically conductive pins 12, a flip-chip semiconductor device 16, a metal cap 14 for enclosing the device 16, and a thermally conductive, highly viscous medium 20 for thermally connecting the device 16 with the metal cap 14. The bond pads (not shown) of flip-chip device 16 are directly soldered to the electrically conductive lead pattern (not shown) on the surface of the substrate 10 such that the device is electrically and physically attached to the package 22 via solder bumps 18. The device 16 is thermally attached to the metal cap 14 by a thermally conductive and highly viscous medium 20 such as silicon grease. The viscosity of medium 20 must be relatively high to ensure that the medium 20 will remain in place. Otherwise, device 16 may subsequently be thermally disconnected from metal cap 14. Since the device 16 is thermally connected to the metal cap 14 which conducts heat quite well, this package does exhibit good thermal characteristics. A drawback of this package, however, is that only flip-chip devices may be accommodated. Furthermore, more expensive ceramic substrates are typically employed because of the high temperature and long time required for flip-chip solder reflow interconnect. This is disadvantageous in that the lead pattern (not shown) on the substrate 10 must correspond to the bond pads on the semiconductor device 16 so that each package may only be used to house a device having bond pads in the proper places. This essentially means that each device requires a custom made package. A more versatile package would be desirable. For an example of the conventional package of FIG. 1, see "Surface Solder Package," by Engle et al., IBM Technical Disclosure Bulletin, vol. 30, No. 3, Aug. 1987, pp. 1240, 1241. However, the more expensive ceramic substrate is required in the concept disclosed in this article.

Figure 2:
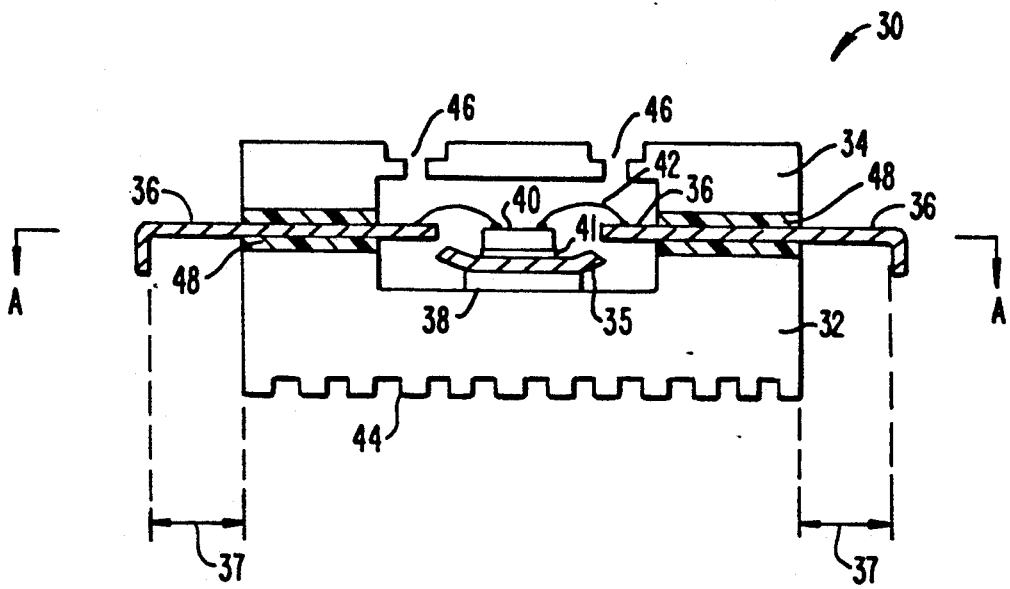
FIG. 2 is a cross-sectional view of a prior art metal package using an epoxy to thermally connect the lead frame to the metallic base.

A cross-sectional view of another prior art package 30 is depicted in FIG. 2 comprising a metal base 32 with heat sinking fins 44, a metal cap 34, and a lead frame having a central portion 35 for holding the semiconductor die 40 and a plurality of electrically conductive leads 36. In FIG. 2 as well as in FIGS. 3-5, the central portion (die attach pad) of the lead frame is attached to the lead frame by means of the bars (not shown). The die 40 is thermally and physically attached to the central portion of the lead frame 35 by a layer of thermally conductive adhesive 41 which is typically silver-filled epoxy. The die 40 is electrically connected to the leads 36 of the lead frame via bond wires 42. A thermally conductive epoxy 38 is inserted between the central portion 35 of the lead frame and the metal base 32. Cap 34 is attached to base 32 by means of epoxy 48.

The purpose of the epoxy 38 is to thermally connect and physically fasten the central portion 35 of the lead frame to the metal base 32. Before the epoxy 38 hardens and acts as an adhesive, however, it must undergo a curing process. This presents several problems. First of all, it is vital that the horizontal alignment of the lead frame be precise with respect to the base 32 so that the leads 36 extend an equal distance 37 on each side of the base 32. Due to this requirement, the lead frame must be meticulously aligned before the epoxy is cured. This alignment must be maintained while the package is transported from the aligning apparatus to the curing apparatus and while the epoxy is being cured because once the epoxy is cured, the lead frame can no longer be moved without being damaged. Keeping the lead frame aligned during transport and curing is a very difficult task which requires much care and extensive tooling and equipment. As a result, it burdens the packaging process. The curing process presents another problem in that a reaction gas is released during the process. Because this gas must be allowed to escape from the package, vent holes 46 are required. The vent holes 46 subsequently need to be refilled thus, requiring an additional step. The package of FIG. 2 is further limited by the fact that only metal or other thermally conductive materials may be used for the housing. A less limited package which is simpler to produce would be more desirable.

Figure 3:
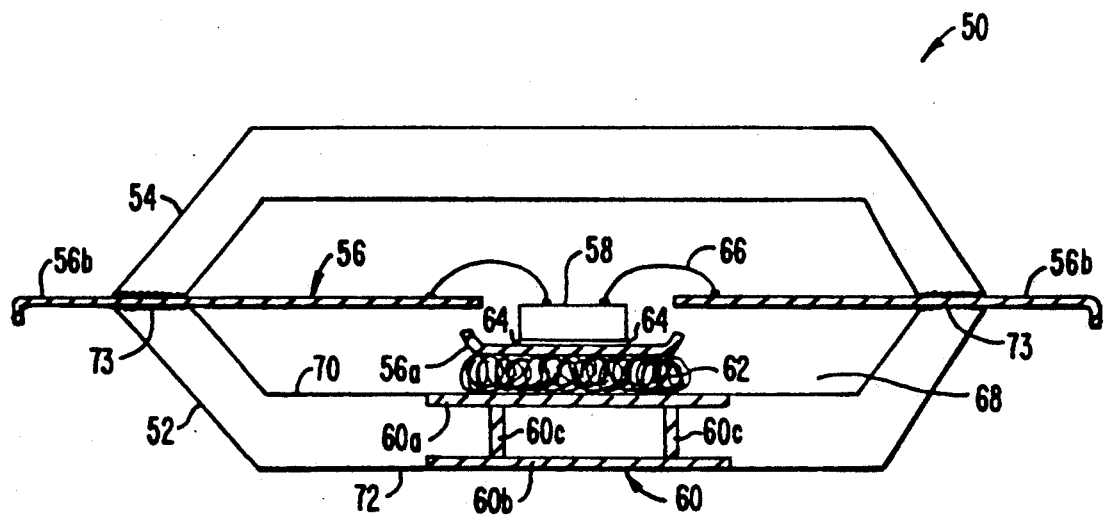
FIG. 3 is a cross-sectional view of a package illustrating a first embodiment of the invention wherein a thermally conductive structure is formed within a portion of a thermally nonconductive housing means.

The package of the invention improves upon the prior art packages in that it is more versatile and simpler to produce. A frontal view of a first preferred embodiment of the invention is illustrated in FIG. 3. The package 50 comprises a clam shell type housing means having a base 52 and a cap 54, a lead frame 56 having a central portion 56a for holding the semiconductor die 58 and a plurality of electrically conductive leads 56b, a thermal path 60 formed within the base 52 of the housing means, and a thermally conductive connecting means 62. The base 52 and the cap 54 are made of insulating or semi-conducting material. For illustrative purposes, it is assumed that the housing portions 52 and 54 are composed of plastic though other materials may also be used. The semiconductor die 58 is thermally and physically attached to the central portion 56a of the lead frame 56 using a thermally conductive adhesive 64 such as silver-filled epoxy. The die 58 is electrically connected to the leads 56 by bonding wires 66. With the die 58 secured to the lead frame 56, the central portion 56a is thermally connected to the thermal path 60 formed within the base 52 by connecting means 62. Connecting means 62 is preferably a thermally conductive and highly viscous material such as diamond-filled silicon grease, diamond paste or zinc oxide compounds. Connecting means 62 is not an adhesive but a gel-like material which remains fairly stationary once it is placed between the central portion 56a and the base 52. It is important that connecting means 62 be sufficiently viscous to ensure that it will remain in place so that a thermal connection is always maintained. A suitable type of silicon grease is DOW CORNING ® 340. Because connecting means 62 is not an adhesive, the lead frame 56 may be moved without being damaged even after connecting means 62 is in place. Also, because connecting means 62 is not an epoxy, it does not need to be cured which, in turn, eliminates the need for vent holes. Therefore, the package of the invention does not encounter any of the problems associated with the adhering of the lead frame to the base of the package experienced in prior art packages.

To allow heat generated within the package to escape, a thermal path 60 is formed within the base 52 of the housing to thermally connect the interior 68 of the package with the external environment. Thermal path 60 comprises a first layer of thermally conductive material 60a placed on the interior face 70 of the base 52, a second layer of thermally conductive material 60b placed on the outer face 72 of the base 52, and a plurality of thermally conductive vias 60c formed within the base 52 to thermally connect the two layers 60a and 60b. The thermal path is preferably made with metal but other types of conductive materials may be used as well. The package as described provides a direct thermal path from device 58 to the exterior of the package. Thus, heat generated by device 58 may travel from the device 58 through thermally conductive adhesive layer 64, through lead frame 56a and conductive means 62, through conductive layer 60a and vias 60c to arrive at the external conductive layer 60b where it can be dissipated. In this manner, the semiconductor device may be maintained at a proper operating temperature.

Figure 4:
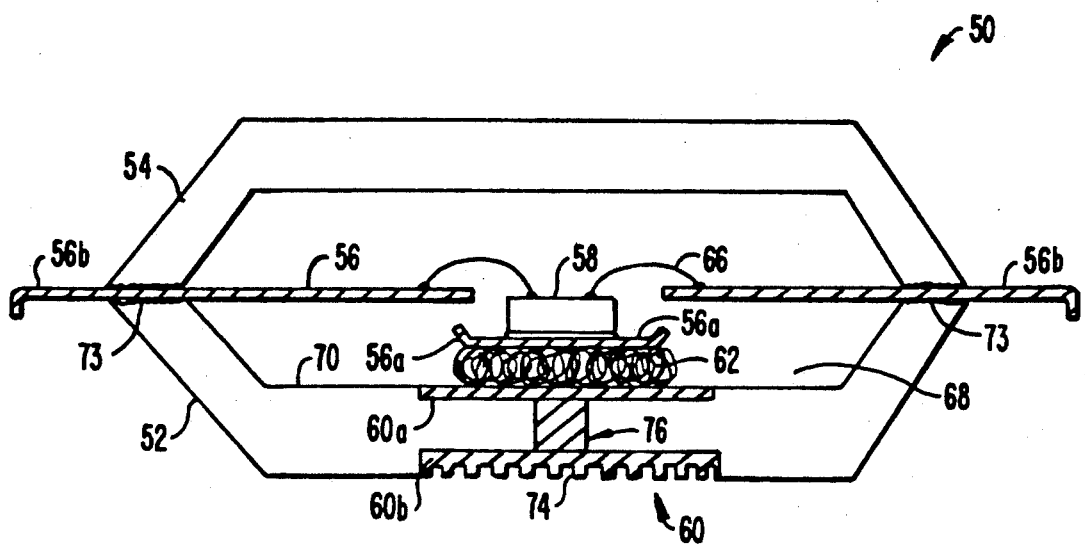
FIG. 4 is a cross-sectional view of a package illustrating a possible alteration of the first embodiment of the invention shown in FIG. 3 showing heat sinking fins on the outer portion of the thermal path and a solid column connecting the two layers of the thermal path instead of a plurality of metal vias.

FIG. 4 is a cross-sectional view of a package illustrating a possible alteration of the first embodiment of the invention shown in FIG. 3, showing heat sinking fins on the outer portion of the thermal path and a solid column connecting the two layers of the thermal path instead of a plurality of metal vias. Referring to FIGS. 3 and 4, to enhance the heat sinking effect of the thermal path 60, the external layer 60b may take the form of a plurality of fins 74 as shown in FIG. 4 or a number of other forms which might enhance its thermal performance. Also, even though the thermal path has been described as having vias 60c, it may take on other forms as well such as that of an "I" 76 as shown in FIG. 4. All such modifications are within the scope of the invention. When all of the necessary components are properly placed onto the base 52, the cap 54 is brought together with the base 52 to form an enclosed chamber. At this point, the lead frame 56 is aligned with respect to the base 52 and the two halves 52 and 54 are sealed together at joints 73 (FIGS. 3, 4).

Thermoplastic packages are especially useful where joints 73 are concerned because joints 73 may be formed by ultrasonic welding instead of having to use an adhesive. This makes the sealing of thermoplastic packages quite simple. With materials other than thermoplastic, some type of adhesive would need to be employed.

Figure 5:
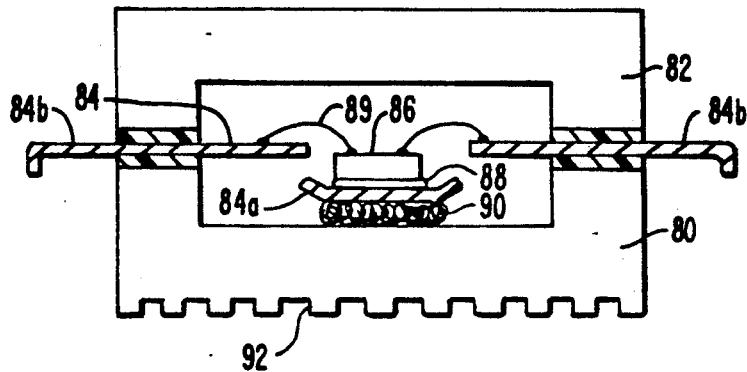
FIG. 5 is a cross-sectional view of a package illustrating an alternate embodiment of the invention wherein a thermally conductive housing means is used.

Thus far, the invention has only been described with reference to thermally nonconductive package housings. The invention may be used with packages using thermally conductive housings as well. A preferred embodiment is illustrated in FIG. 5 comprising a thermally conductive base 80, a thermally conductive cap 82, and a lead frame 84 having a central portion 84a for holding a semiconductor die 86 and a plurality of leads 84b. Semiconductor die 86 is thermally and physically attached to the central portion 84a of lead frame 84 by thermally conductive adhesive layer 88 and electrically attached to leads 84b via bonding wires 89. The lead frame 84 is thermally connected to the base 80 by a thermally conductive and highly viscous connecting means 90 such as silicon grease or zinc oxide. Because the base 80 is composed of a thermally conducting material, no thermal path needs to be formed within the base 80. Base 80 and cap 84 are preferably made of metal although other conductive materials may be used as well. To enhance its heat sinking, the bottom of base 80 may take the form of a plurality of fins 92 or a number of other forms which might enhance its thermal performance. By thermally connecting lead frame 84a to the base 80, a thermal path is created from the device to the exterior of the package thus, allowing the package to dissipate heat generated by the device 86. Since connecting means 90 does not physically fasten the lead frame 84 to the base 80, the package of the invention does not need to undergo any difficult process of maintaining alignment while the lead frame 84a is being adhered to the base 80. Also, because connecting means 90 is not an epoxy, no curing step or vent holes are necessary. Therefore, the package of the invention is a significant improvement over the prior art metal packages.

The invention as disclosed provides a number of advantages over the prior packages. First, the package of the invention can accommodate lead frames and bonding wires unlike the prior flip-chip chip packages. Lead frames provide more flexibility in that a package need not be custom made for each semiconductor chip. Second, since the invention may be implemented using a housing means made of mostly plastic which is quite inexpensive, a cost effective package may be produced. Also, because it is quite simple to mold a metal structure into a plastic package, a package embodying the invention can be quickly and easily produced. Third, the invention utilizes a highly viscous medium instead of an epoxy to thermally connect the lead frame to the conductive path. This obviates the need for a curing process as well as the need for vent holes which makes the packages much easier to produce. Furthermore, the invention may be implemented in a number of different types of packages from plastic to metal to ceramic, thereby, providing a high degree of versatility. Therefore, the package of the invention provides significant advantages over the packages of the prior art.

Figure 6:
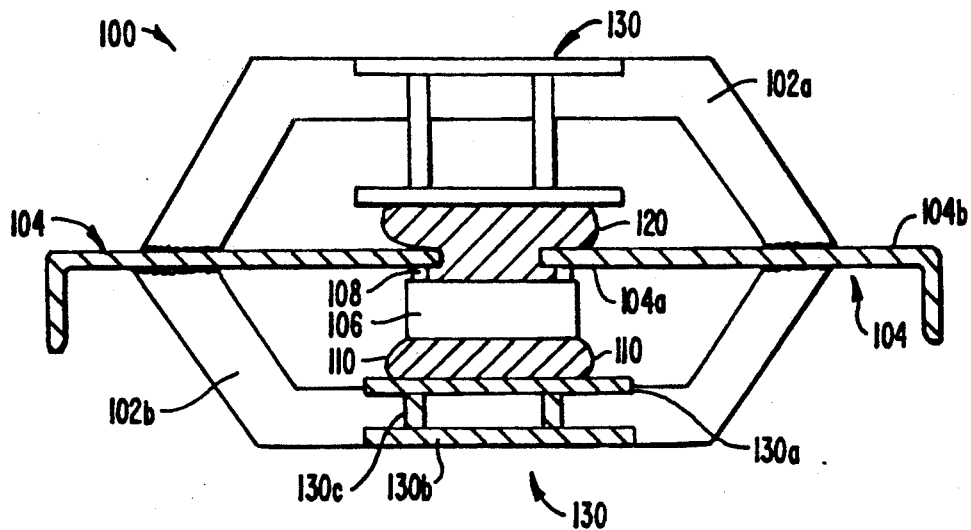
FIG. 6 is a cross-sectional view of a package illustrating a second alternate embodiment of the invention involving a tape automated bonding type package.

The invention is also applicable in TAB packages. FIG. 6 is a cross-sectional view of such a package employing the invention to illustrate a second alternative embodiment. As shown in FIG. 6, TAB package 100 includes a semiconductor device such as a die 106 electrically connected and physically attached to conductive traces (not shown) on a substrate 104 by bonding means such as solder 108, such as known in tape automated bonding. Housing 102 includes a top shell 102a and bottom shell 102b. A layer of a thermally conductive material 110 such as thermal grease or zinc oxide is placed on top of the bottom half shell 102b of the package housing. After being connected as described above, the device 106 and substrate 104 structure are then placed on top of the bottom shell 102b with device 106 supported and in contact with layer 110 and the end 104b of the tape substrate also supported by the sidewalls of the bottom shell 102b of the housing. Since no bonding wires are used for electrically connecting device 106 to other devices outside the package 100, the application of another material on the top surface of device 106 will not cause damage to bonding wires or wire bonds. Therefore, a thermally conductive material 120 may be applied to the top surface of device 106 where the amount of the material viscous so that it will contact a thermally conductive path 130 in the bottom surface of the top half shell 102a of the housing when shell 102a is placed on top of substrate 104 as shown in FIG. 6. Thus layer 110 sitting on top of the bottom shell 102b contacts the bottom surface of device 106 and layer 120 placed on the top surface of device 106 contacts the conductive 130 in the bottom surface of the top shell 102a to form two conductive paths from die 106 to the outside environment through heat sinks 130. As shown in FIG. 6, path 130 preferably protrudes downwards beyond the bottom surface of top shell 102a to reduce the amount of silicon grease, zinc oxide, or other kinds of thermally conductive material in layer 120. For similar reasons, the top surface of conductive layer 130a is raised to a level above the top surface of bottom shell 102b as shown in FIG. 6. Such arrangements may be also applied in the other embodiments of this invention to reduce the amount of material used in layers connecting means 62 in FIGS. 3, 4. Layers 110, 120 are not physically attached to device 106 so that they need not be properly aligned in position in relation to housing 102 or device 106.

The heat sink 130 may be constructed in a manner similar to those described above in reference to FIGS. 3 and 4. Alternatively, the top and bottom shells 102a, 102b may be made of a thermally conductive material. The two shells will then serve as heat sinks so that the heat sinks 130 shown in FIG. 6 are no longer necessary. All such variations are within the scope of the invention. Similarly, the same invention can be applied to other wireless interconnect.

The embodiments in FIGS. 3-6 are alike in that the semiconductor device is supported by a holding means having at least a thermally conductive portion (62, 90, 110) connected thermally to the device in the thermal path (60, 80, 130). Where a lead frame is employed such as in FIGS. 3-5, the holding means also includes at least a portion (56a, 84a, 104a) of the lead frame. As shown in FIG. 6, where wire bonds are not used, a second thermally conductive path 120 may be established on the opposite side of device 106 than layer 110 to further help dissipate the heat from the semiconductor device. The additional thermally conductive path 120 increases the heat dissipation capability by 100% compared to conventional packages, and is particularly advantageous.

It should be noted that although the invention has been described with reference to specific embodiments, it should not be construed to be so limited. Various modifications can be made by one of ordinary skill in the art with the benefit of this disclosure without departing from the spirit of the invention. For example, the invention has been described with reference to packages having a housing means with two portions, a base and a cap. The invention is not limited to only these housing means but to others having different geometries as well. This and other modifications will be clear to those skilled in the art. Therefore, the invention should not be limited by the examples used for the purpose of illustration but only by the scope of the appended claims.

What is claimed is:

1. A package for housing a semiconductor device comprising:
   a holding means for supporting said semiconductor device, said holding means including a central portion of a lead frame, and means for thermally connecting and attaching said semiconductor device to said central portion, said lead frame having a plurality of conductive leads extending outward away from said central portion;
   a housing means having at least two portions, said portions adapted to join together to form an enclosed chamber for enclosing said holding means and said semiconductor device;
   wherein said housing means has a thermal path within at least one of said housing portions, said thermal path thermally connecting the interior of said enclosed chamber to the exterior of said housing means; and
   wherein said holding means thermally connects said device to said thermal path so as to dissipate heat originating from said device, but does not permanently attach said device to said thermal path so that lateral movement of said lead frame is permitted with respect to the housing means without breaking the thermal connection between the lead frame and the path, thus allowing predetermined portions of said plurality of conductive leads to be positioned to extend out of said housing means to desired distances.

2. The package of claim 1, said holding means including
   a thermally conductive connecting means placed between the central portion of said lead frame and said thermal path for thermally connecting said central portion with said thermal path, thereby, conducting heat generated by said device from said central portion of said lead frame to the exterior of said housing means.

3. The package of claim 1, wherein said portions of said housing means are composed of a heat insulating plastic material, except for said thermal path which is composed of a thermally conductive material.

4. The package of claim 1, wherein said thermal path is a heat sink comprising a first layer of thermally conductive material placed in the interior of said housing means, a second layer of thermally conductive material placed on the exterior of said housing means, and at least one thermally conductive structure formed within at least one of said housing portions for thermally connecting said first and second layers, and wherein said heat sink is composed of a material with a higher thermal conductivity than said portions of said housing means.

5. The package of claim 4, wherein said thermally conductive material is a metal.

6. The package of claim 2, whereins aid thermally conductive connecting means is composed of a thermally conductive material having at least a minimum specified coefficient of viscosity.

7. The package of claim 6, wherein said thermally conductive material is silicon grease.

8. The package of claim 6, wherein said thermally conductive material is zinc oxide.

9. The package of claim 2, said thermally conductive connecting means being composed of thermally conductive material, whereins aid thermally conductive material is a diamond paste.

10. The package of claim 2, said housing means being composed of a thermally conductive material, so that the housing means is also the thermally conductive path.

11. The package of claim 10, said device having two opposite sides, wherein said holding means supports and is in thermal contact with one side of said device and the connecting means is in thermal contact with the opposite side of said device.

12. The package of claim 1, said housing means having a first and a second portion, said first and second portions each having a thermal path, said holding means thermally connecting said device to the thermal path of said first portion, said package further comprising:

a thermally conductive connecting means thermally connecting said device to the thermal path of said second portion of said housing means.

13. The package of claim 12, wherein said connecting means and said holding means comprise a thermally conductive viscous material.

* * * * *